United States Patent
Kawata

(10) Patent No.: US 7,816,183 B2
(45) Date of Patent: Oct. 19, 2010

(54) METHOD OF MAKING A MULTI-LAYERED SEMICONDUCTOR DEVICE

(75) Inventor: Tsutomu Kawata, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 166 days.

(21) Appl. No.: 11/960,760

(22) Filed: Dec. 20, 2007

(65) Prior Publication Data

US 2008/0157328 A1 Jul. 3, 2008

(30) Foreign Application Priority Data

Dec. 27, 2006 (JP) ............................. 2006-352041

(51) Int. Cl.
*H01L 21/00* (2006.01)
(52) U.S. Cl. .................. 438/109; 438/118; 438/126
(58) Field of Classification Search ............... 257/686; 438/106–109, 118, 125, 126
See application file for complete search history.

(56) References Cited

U.S. PATENT DOCUMENTS 5,608,265 A * 3/1997 Kitano et al. ............... 257/738
5,640,051 A * 6/1997 Tomura et al. ............. 257/778
6,614,104 B2 * 9/2003 Farnworth et al. .......... 257/686
6,933,613 B2 * 8/2005 Akashi ....................... 257/778

FOREIGN PATENT DOCUMENTS

| JP | 6-268101 | 9/1994 |
| JP | 2002-252326 | 9/2002 |
| JP | 2004-172157 | 6/2004 |
| JP | 2004-289002 | 10/2004 |

* cited by examiner

*Primary Examiner*—Leonardo Andújar
(74) *Attorney, Agent, or Firm*—Young & Thompson

(57) ABSTRACT

In the multiple-layered semiconductor device and the method for manufacturing thereof according to the present invention, the resin is formed on the substrate around the semiconductor device, on which the semiconductor device is installed in the first semiconductor package. Therefore, a generation of a warpage of substrate is inhibited in the first semiconductor package. And since the first semiconductor package is stacked to and coupled to the second semiconductor package via the electric conductors that extend from the back surface of the second semiconductor package to the coupling lands on the substrate penetrating through the resin, a defective situation such as a coupling defective in the bump junction can be avoided when the junction of the second semiconductor package via the electric conductor is formed. Therefore, a considerably improved coupling reliability in the multiple-layered semiconductor device can be achieved.

4 Claims, 10 Drawing Sheets

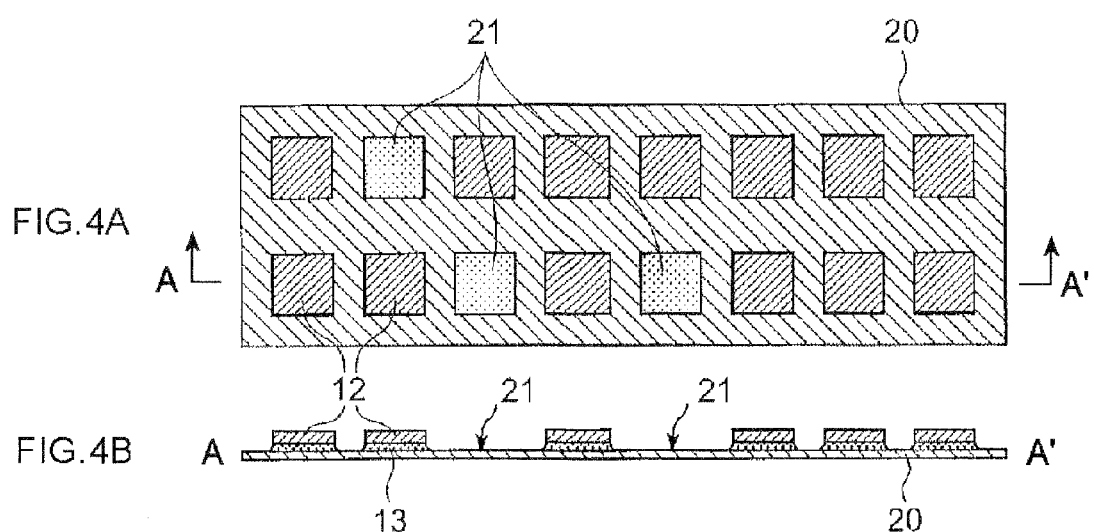
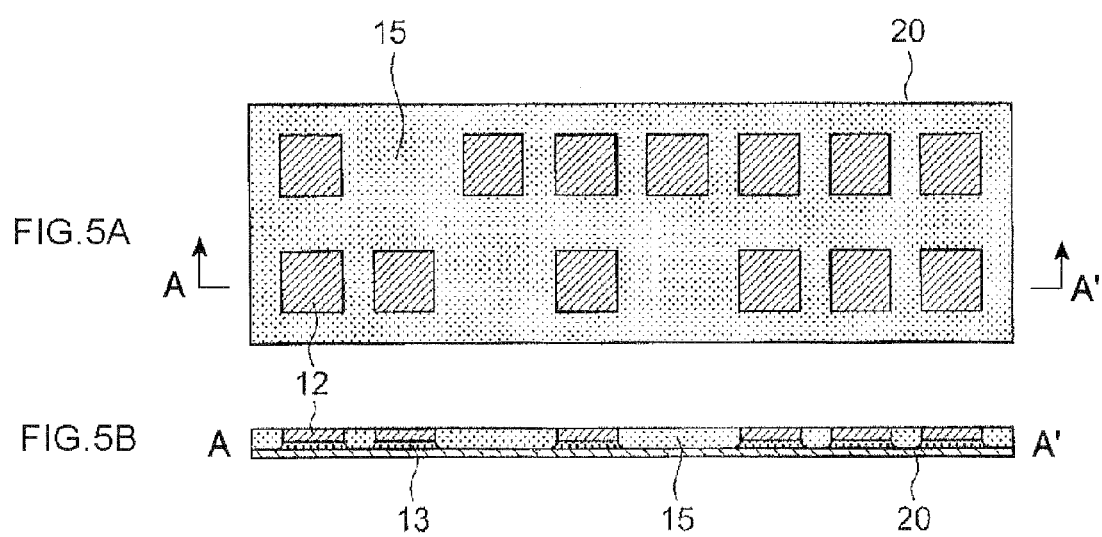

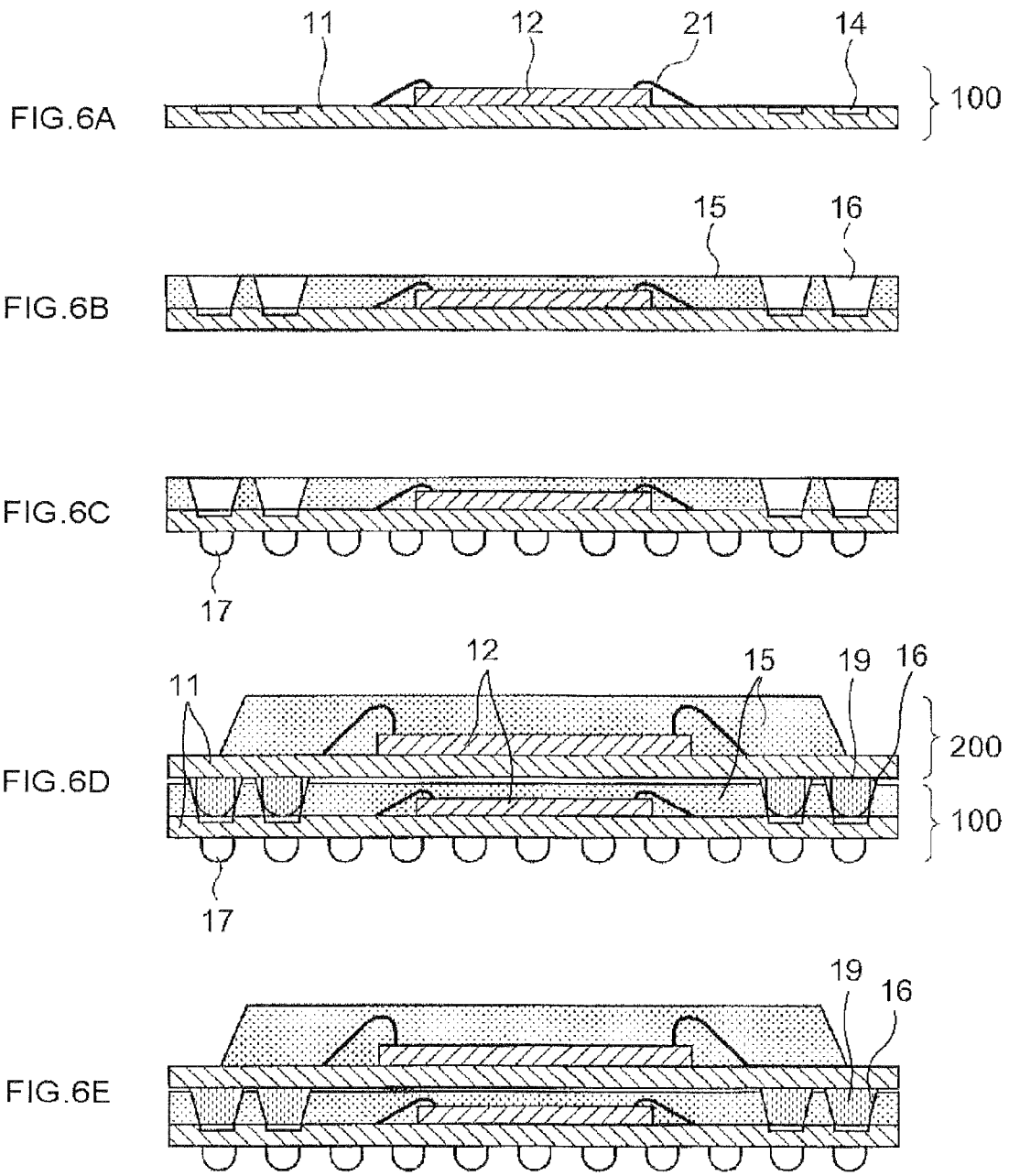

METHOD OF MAKING A MULTI-LAYERED SEMICONDUCTOR DEVICE

This application is based on Japanese patent application No. 2006-352,041, the content of which is incorporated hereinto by reference.

BACKGROUND

1. Technical Field

The present invention relates to a semiconductor device and a method for manufacturing thereof, and more particularly relates to a multiple-layered semiconductor device composed of two or more stacked semiconductor packages, and a method for manufacturing thereof.

2. Related Art

Technologies for three-dimensionally stacking a plurality of semiconductor packages, each of which includes logic elements and memory circuit elements installed therein, attract attentions as semiconductor package technologies that can achieve higher integration levels and multiple-functioning capabilities of semiconductor devices. Semiconductor devices having such three-dimensional multiple-layered structure are generally referred to as package on package (PoP) or stack package.

Since the PoP structure provides a capability of selecting desired combinations of logic circuits and memory circuits in accordance with applications in the and also provides a capability of three-dimensionally stacks the selected elements, a reduction in effective dimensional area can be achieved. Thus, such structure is generally employed for smaller, thinner and multiple-functioning devices represented by portable telephones or the like.

An example of a cross-sectional structure according to a conventional PoP structure is shown in FIG. 10. A first semiconductor package 300 disposed as a lower layer includes a semiconductor device 312 flip-chip coupled onto a substrate 311 that includes coupling lands 314 in a circumference portion thereof, and a space between the substrate 311 and the semiconductor device 312 is filled with an underfill resin 313. Ball electrodes 317 serving as external coupling terminals are formed on the back surface of the substrate 311.

A second semiconductor package 400 disposed as an upper layer includes a semiconductor device 312 on another substrate 311 that is coupled thereto by wire bonding, and is encapsulated with a resin 315. The first semiconductor package 300 is joined to the second semiconductor package 400 via solder bumps 319 to configure the PoP structure.

Typical conventional technologies related to the present invention are included in, for example, Japanese Patent Laid-Open No. 2004-289,002, Japanese Patent Laid-Open No. 2002-252,326 and Japanese Patent Laid-Open No. 2004-172,157.

In addition, Japanese Patent Laid-Open No. H6-268,101 (1994) discloses a typical technology related to a pin grid array (PGA) package, in which the whole semiconductor package is encapsulated with a resin and a plurality of openings extending from the surface of the package to the internal lead frame surface are formed. Further configuration is also disclosed therein, which includes a stack of a plurality of packages formed through electro-conductive bumps provided in the openings.

Meanwhile, since these openings are provided for the purpose of providing a multiple-pin package that achieves an improved mass productivity and since such technology is related to the PGA package, the semiconductor device is installed on a tab, and is not provided on the thin substrate of the present invention.

In the above-described conventional technologies, the following problems are caused.

In order to achieve smaller and thinner devices that are required for the PoP structure, it is necessary to provide a thinner substrate and/or a thinner semiconductor device, which are component of the package.

However, the stiffness of the substrate depends upon the thickness of the substrate, and thus thinner substrate exhibits lower stiffness. Lower stiffness of the substrate possibly leads to a generation of a warpage. In addition to above, the substrate employed here includes an interconnect layer that connects coupling terminals on the front surface to coupling terminals on the back surface, and further includes an interposer.

A cross-sectional view for describing the problems in the conventional technology is shown in FIGS. 11A and 11B. FIG. 11A shows a first semiconductor package 300 and a second semiconductor package 400 in a condition before stacking and coupling. The first semiconductor package 300 provides a flip-chip coupling of a semiconductor device 312 onto a substrate 311 having coupling lands 314, and a gap between the substrate 311 and the semiconductor device 312 is filled with an underfill resin 313. The second semiconductor package 400 shown here as an example includes the semiconductor device 312 coupled by wire bonding.

In general, the whole semiconductor device 312 and a circumference thereof are encapsulated with a resin in processes for manufacturing the semiconductor device, for the purpose of providing a protection of the semiconductor device 312. The presence of such resin causes a shrinkage stress in a cure process after a supply of the resin, leading to a warpage in the substrate 311 of the first semiconductor package 300 as shown in FIG. 11A.

Thus, since a warpage is generated in the first semiconductor package 300, a defective situation such as a generation of coupling defectives 327 may be caused between the solder bumps 319 and the coupling land 314 of the first semiconductor package 300, when the first semiconductor package 300 is stacked to and coupled to the second semiconductor package 400 via electric conductors such as solder bumps 319 as shown in FIG. 11B, causing a problem of considerably deteriorating reliability for multiple-layered type semiconductor devices.

SUMMARY

According to one aspect of the present invention, there is provided a multiple-layered semiconductor device having a multiple-layered structure including stacked two or more semiconductor packages, wherein a first semiconductor package, being disposed in a layer other than a top layer in the multiple-layered structure, includes a substrate, a semiconductor device installed on said substrate and a resin formed on said substrate around the semiconductor device, wherein the first semiconductor package is stacked to and coupled to a second semiconductor package via an electric conductor that extends from a back surface of said second semiconductor package to a coupling land on said substrate penetrating through said resin.

According to another aspect of the present invention, there is provided a method for manufacturing a multiple-layered semiconductor device having a multiple-layered structure including stacked two or more semiconductor packages, comprising: installing a semiconductor device on a substrate including a coupling land that is provided in a first semiconductor package, said first semiconductor package being disposed in a layer other than a top layer in the multiple-layered structure; forming a resin on said substrate around said semiconductor device; forming a plurality of openings extending from an upper surface of said resin to said coupling land; forming an external coupling terminal in a back surface of said substrate; and stacking and coupling a second semiconductor package onto said first semiconductor package.

In the multiple-layered semiconductor device and the method for manufacturing thereof according to the present invention, the resin is formed on the substrate around the semiconductor device, on which the semiconductor device is installed in the first semiconductor package. Therefore, a generation of a warpage of substrate is inhibited in the first semiconductor package. And since the first semiconductor package is stacked to and coupled to the second semiconductor package via the electric conductors that extend from the back surface of the second semiconductor package to the coupling lands on the substrate penetrating through the resin, a defective situation such as a coupling defective in the bump junction can be avoided when the junction of the second semiconductor package via the electric conductor is formed. Therefore, a considerably improved coupling reliability in the multiple-layered semiconductor device can be achieved.

According to the present invention, the multiple-layered semiconductor device, which exhibits a reduced warpage and an improved reliability of the multiple-layered semiconductor device, and the method for manufacturing thereof, are achieved.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 4A and 4B are a cross-sectional view and a plan view of a conventional semiconductor device, respectively, useful in describing a conventional example in relation to first embodiment of the present invention;

FIG. 5A and FIG. 5B are a plan view and a cross-sectional view of the semiconductor device according to first embodiment of the present invention;

FIGS. 6A to 6E are cross-sectional views, useful in describing a process for manufacturing the semiconductor device according to second embodiment of the present invention;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of the present invention will be described in reference to annexed figures. In the following description, a term "semiconductor package" will be generally employed as indicating a semiconductor device.

First Embodiment

Figure 1A:
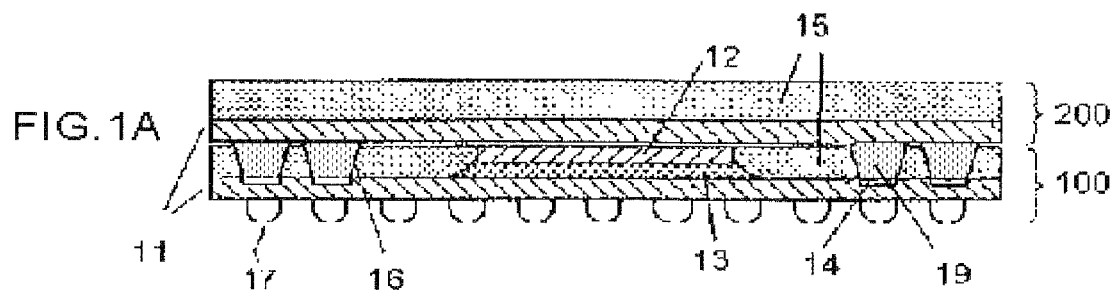
FIG. 1A is a cross-sectional view of a semiconductor device according to first embodiment of the present invention.
Figure 1B:
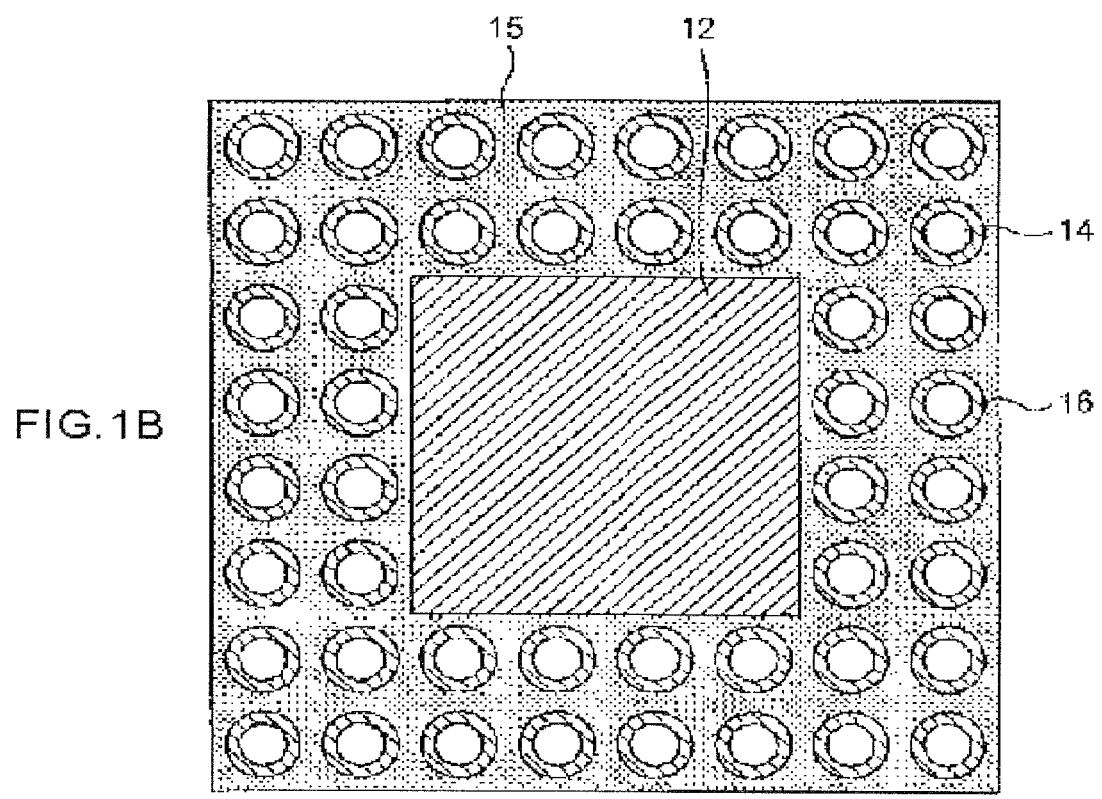
FIG. 1B is a plan view thereof.

FIG. 1A is a cross-sectional view of a semiconductor device according to first embodiment of the present invention, and FIG. 1B is a plan view thereof. In FIG. 1A, an example of a cross-sectional structure of a PoP is illustrated. The structure includes a configuration of a first semiconductor package 100 that is stacked and coupled to a second semiconductor package 200. Since the present embodiment is directed to a semiconductor device of a dual-layered structure, the semiconductor device includes the second semiconductor package 200 disposed as an uppermost layer.

Here, the first semiconductor package 100 includes a semiconductor element 12 that is flip-chip coupled to a substrate 11, and an underfill resin 13 fills spaces between the substrate 11 and the semiconductor element 12. A circumference portion of the semiconductor element 12 is provided with a coupling land 14, and the whole substrate 11 except the region where the semiconductor element 12 is formed is encapsulated with the resin 15. While the resin 15 may alternatively be formed so as to cover the whole substrate 11 including the region where the semiconductor element 12 is formed, it is preferable to employed the configuration of forming the resin 15 over the substrate 11 except the region where the semiconductor element 12 is formed and thus exposing the upper surface of as shown in FIG. 1A, in consideration of achieving thinner multiple-layered semiconductor device.

FIG. 1B is a plan view of the first semiconductor package 100. Openings 16 are formed to extend from an upper surface of the resin 15 on the first semiconductor package 100 to the coupling land 14 on the substrate 11. While the openings 16 shown in FIG. 1A are taper-shaped, the geometry is not limited thereto, and for example, the upper surface of the opening may alternatively has substantially the same diameter as the lower surface. Ball electrodes 17 serving as external coupling terminals are formed in the back surface of the substrate 11. In addition to above, it is not required that the openings 16 are formed over the whole coupling land 14 on substrate 11.

The structure of the second semiconductor package 200 is not limited to a specific structure, and for example, a flip-chip ball grid array (BGA) or a tape BGA may be employed. The first semiconductor package 100 is coupled to the second semiconductor package 200 via electric conductors such as solder bumps 19 on the back surface of the second semiconductor package.

Figure 2:
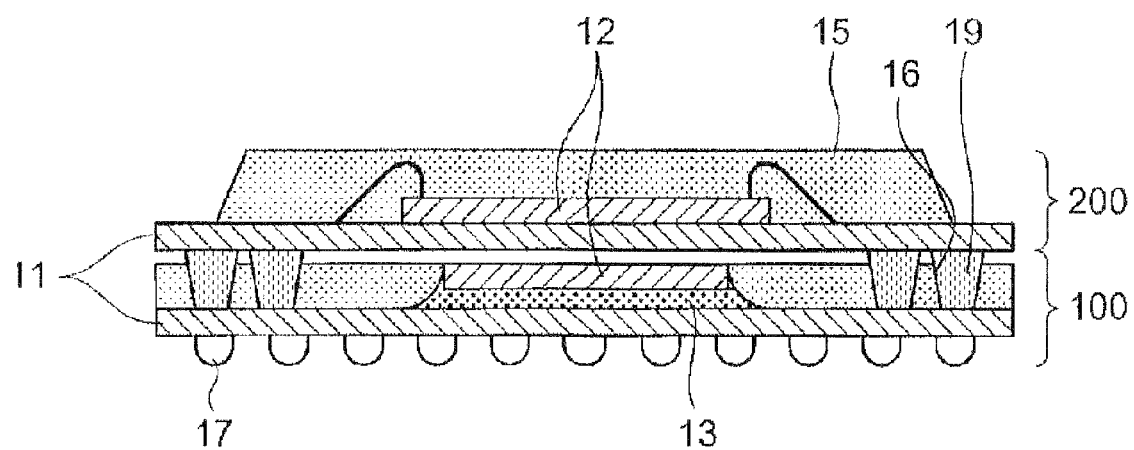
FIG. 2 is a cross-sectional view of the semiconductor device according to first embodiment of the present invention.

FIG. 2 is a cross-sectional view of the semiconductor device according to first embodiment of the present invention. FIG. 2 shows a cross sectional structure of a PoP, in which the semiconductor element 12 is coupled to the substrate 11 by wire bonding in the second semiconductor package 200. The structure of the first semiconductor package 100 of the lower layer is the same as the first semiconductor package described above in reference to FIG. 1.

The first semiconductor package 100 is electrically coupled to the second semiconductor package 200, via the electric conductors such as the solder bumps 19 in the openings 16 formed in the first semiconductor package 100.

In addition to above, types and combinations of the packages in the upper and the lower layers and number of the stacked semiconductor packages are not limited thereto, and may be suitably selected in accordance with the application.

Next, a typical process for manufacturing the semiconductor device according to the present invention will be described in reference to FIGS. 3A to 3F.

Figure 3A:
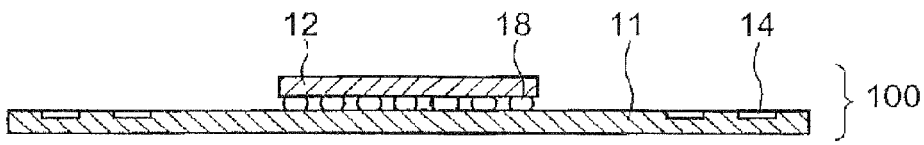
FIGS. 3A to 3F are cross-sectional views, useful in describing a process for manufacturing the semiconductor device according to first embodiment of the present invention.

As shown in FIG. 3A, the semiconductor element 12 is installed onto the substrate 11 of the first semiconductor package 100 via the solder balls 18 by a flip-chip coupling. In addition to above, the coupling land 14 is formed on the substrate 11.

Figure 3B:
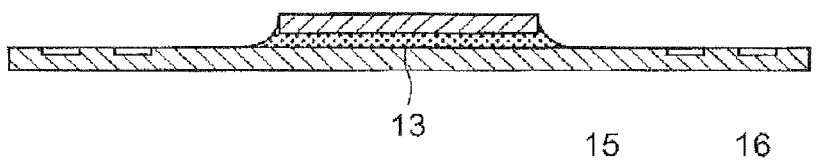

Further, as shown in FIG. 3B, gaps between the substrate 11 and the semiconductor element 12 are filled with the underfill resin 13.

Figure 3C:

Next, as shown in FIG. 3C, the substrate 11 is encapsulated with the resin 15 formed on the substrate 11 around the semiconductor element 12. In addition to above, the resin encapsulation is not required to be carried out separately from the filling with the underfill resin 13 described in reference to FIG. 3B, and these operations may be simultaneously conducted.

In addition, as shown in FIG. 3C, when the whole substrate 11 is encapsulated with a resin, the openings 16 extending from the upper surface of the resin 15 to the coupling land 14 on the substrate 11 are provided. In addition to above, the openings 16 are preliminarily arranged and formed so as to be conformable to the position and the dimension of the coupled portion on the back surface of the second semiconductor package 200 stacked as the upper layer.

A typical example for providing the openings 16 is a process for conducting a resin-transfer encapsulation over the upper surface of the substrate 11 with a metal mold (not shown), which is provided with convex portions having geometries that correspond to the geometries of the desired openings 16 in the coupling land 14, so that the resin 15 does not enter into such convex portions, thereby providing the desired openings 16.

Figure 3D:
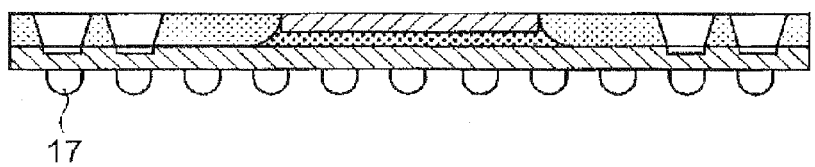

Subsequently, as shown in FIG. 3D, the ball electrodes 17 serving as the external coupling terminals are formed on the back surface of the first semiconductor package 100.

Figure 3E:
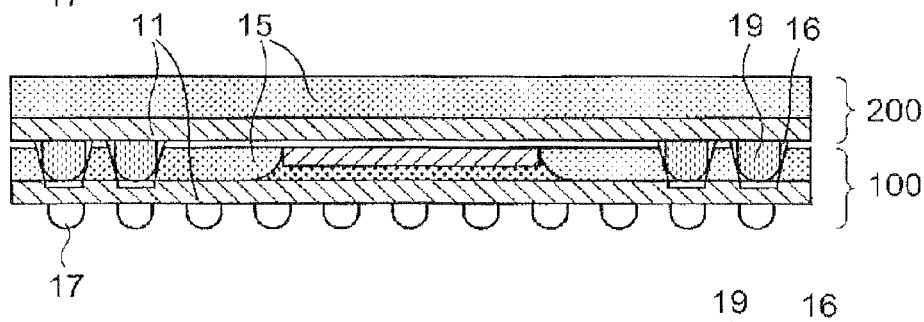

Next, as shown in FIG. 3E, the second semiconductor package 200 is coupled to the coupling land 14 of the first semiconductor package 100 via the electric conductors such as solder bumps 19 formed on the back surface of the substrate 11 of the second semiconductor package 200. The solder bumps 19 of the second semiconductor package 200 are suitably inserted into the associated openings 16 of the first semiconductor package 100, so that the first semiconductor package 100 is coupled to the second semiconductor package 200.

In addition to above, the structure of the second semiconductor package 200 employed here is not limited to a specific structure, and for example, a flip-chip BGA or a tape BGA may be employed.

Figure 3F:
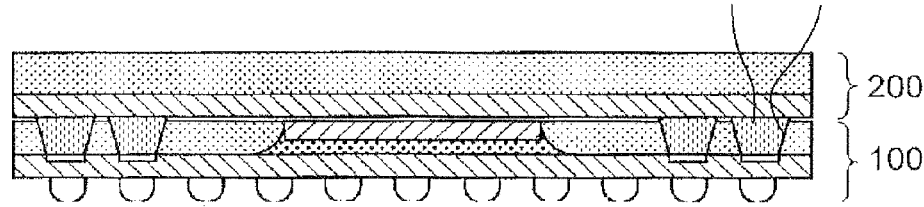

Subsequently, as shown in FIG. 3F, a reflow process is conducted to cause the solder bumps 19 of the second semiconductor package 200 being melted, so that the geometries of the bumps conform to the geometries of the opening 16 of the first semiconductor package 100. The first semiconductor package 100 is electrically joined to the second semiconductor package 200 to provide a finished PoP structure.

Since a generation of a warpage is inhibited in the first semiconductor package 100 according to the present embodiment, a defective situation such as a coupling defective in the bump junction can be avoided when the junction of the second semiconductor package 200 via the solder bumps 19 is formed. Further, since the connection strength is maintained, a defective situation of the case during the installation of the PoP onto the mother board is eliminated.

In addition to above in general, when such type of semiconductor devices, in particular the first semiconductor package 100, is manufactured, the substrate employed here is not limited to the substrate in the form of a single piece prepared for each of the semiconductor elements, and a matrix substrate, on which semiconductor elements are arranged to form a lattice-pattern may alternatively be employed. Details of such matrix substrate will be described as follows.

FIG. 4A and FIG. 4B are a plan view and a cross-sectional view of a conventional matrix substrate 20, respectively. As shown in these diagrams, in such matrix substrate 20, defective sites 21 may also coexist in the matrix substrate 20. Such defective sites 21 are present in the matrix substrate 20 at random, and no semiconductor element 12 is installed in such sections. In addition to above, in FIGS. 4A and 4B, the exemplary implementation of semiconductor element 12 as being flip-chip coupled is illustrated.

In such case, concave and convex are randomly caused in response to portions with the semiconductor elements 12 and portions without the semiconductor element 12 for the entire substrate, as shown in FIG. 4B. Thus, when ball electrodes serving as external coupling terminals are formed (ball mount) or when the matrix substrate 20 are diced into semiconductor packages, some innovation on the equipments such as employing special jigs dedicated for the processing is required.

In addition, when the ball mounts or the packages are obtained by dicing, the matrix substrate 20 is, in general, fixed and held by a vacuum suction. However, if some defective sites 21 is included in the matrix substrate 20, which are not provided with semiconductor element 12, a vacuum leakage is caused due to steps created between the sites with the semiconductor element and the sites without the semiconductor element, leading to a difficulty in stably holding the substrate (see FIG. 4B). In order stably holding thereof, it is necessary to suction the regions without semiconductor element 12, and thus precisely processed special suction jigs may be required.

Further, steps are generated between the sites with the semiconductor element and the sites without the semiconductor element, a defective situation is caused during the cut-off process for dicing the semiconductor device.

On the other hand, FIG. 5A and FIG. 5B are a plan view and a cross-sectional view of a matrix substrate according to the present invention, respectively. As shown in FIGS. 5A and 5B, in the semiconductor device according to the present invention, even if the matrix substrate 20 includes a site without semiconductor element 12, the whole matrix substrate 20 is smoothly encapsulated with a resin 15, and thus the process is not adversely affected by influences of the defective sites randomly generated on the matrix substrate 20. Since the whole matrix substrate 20 is encapsulated with the resin 15, no concave and convex due to an existence or non-existence of the semiconductor element 12 is caused (FIG. 5B). This allows providing a benefit in the manufacture of avoiding a need for preparing precisely processed special suction jigs.

Second Embodiment

The present embodiment is similar as first embodiment, except that the first semiconductor package is formed by a wire bonding. Similar advantageous effect as obtained in the above-described embodiment is also obtained in the present embodiment.

A typical process for manufacturing the semiconductor device according to the present invention will be described in reference to FIGS. 6A to 6E.

As shown in FIG. 6A, the semiconductor element 12 is mounted on the substrate 11 of the first semiconductor package 100, and is coupled by wires 21. In addition to above, the coupling land 14 is formed on the substrate 11.

Next, the whole substrate 11 is encapsulated with the resin 15. As shown in FIG. 6B, when the whole substrate 11 is encapsulated with a resin, the openings 16 extending from the upper surface of the resin 15 to the coupling land 14 on the substrate 11 are provided. In addition to above, the openings 16 are preliminarily arranged and formed so as to be conformable to the position and the dimension of the coupled portion on the back surface of the second semiconductor package 200 stacked as the upper layer.

A typical example for providing the openings 16 is a process for conducting a resin-transfer encapsulation over the upper surface of the substrate 11 with a metal mold (not shown), which is provided with convex portions having geometries that correspond to the geometries of the desired openings 16 in the coupling land 14, so that the resin 15 does not enter into such convex portions, thereby providing the desired openings 16.

Subsequently, as shown in FIG. 6C, the ball electrodes 17 serving as the external coupling terminals are formed on the back surface of the first semiconductor package 100.

Next, as shown in FIG. 6D, the second semiconductor package 200 is coupled to the coupling land 14 of the first semiconductor package 100 via the electric conductors such as solder bumps 19 formed on the back surface thereof. The solder bumps 19 of the second semiconductor package 200 are suitably inserted into the associated openings 16 of the first semiconductor package 100, so that the first semiconductor package 100 is coupled to the second semiconductor package 200.

In addition to above, the second semiconductor package 200 is formed by, for example, a wire bonding.

Subsequently, as shown in FIG. 6E, a reflow process is conducted to cause the solder bumps 19 of the second semiconductor package 200 being melted, so that the geometries of the bumps conform to the geometries of the opening 16 of the first semiconductor package 100. The first semiconductor package 100 is electrically joined to the second semiconductor package 200 to provide a finished PoP structure.

Third Embodiment

The present embodiment is characterized in the process for stacking the second semiconductor package over the first semiconductor package. Therefore, other processes in the manufacture are similar as that of first embodiment or second embodiment, and the description is not repeated. Similar advantageous effect as obtained in the above-described embodiment is also obtained in the present embodiment.

Figure 7A:
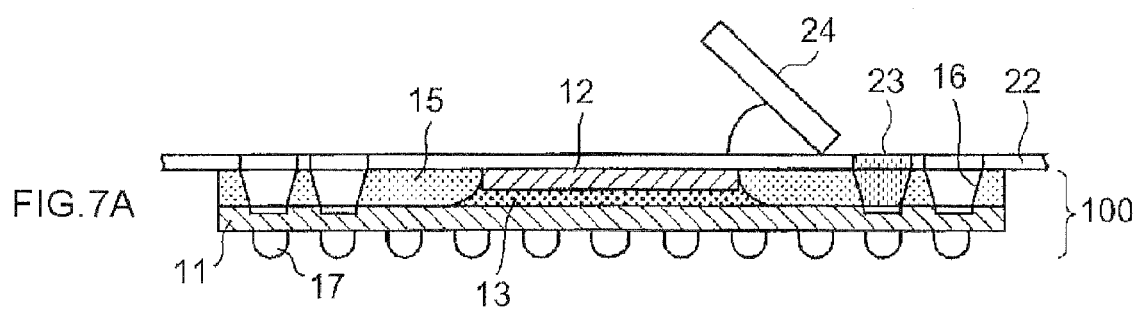
FIGS. 7A to 7C are cross-sectional views of a semiconductor device illustrating third embodiment of the present invention.

As shown in FIG. 7A, a screen mask 22 is disposed over the first semiconductor package 100 having the openings 16, and the openings 16 are filled with an electro-conductive material 23 such as soldering paste and the like by employing a squeegee 24.

Figure 7B:
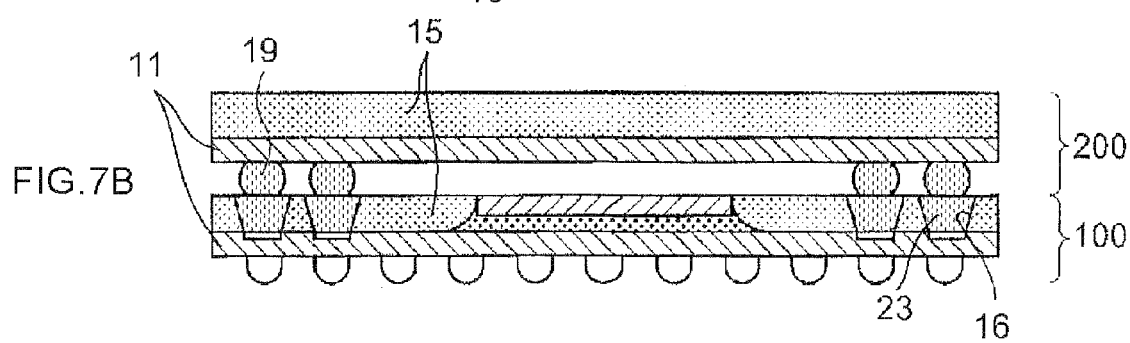
Figure 7C:
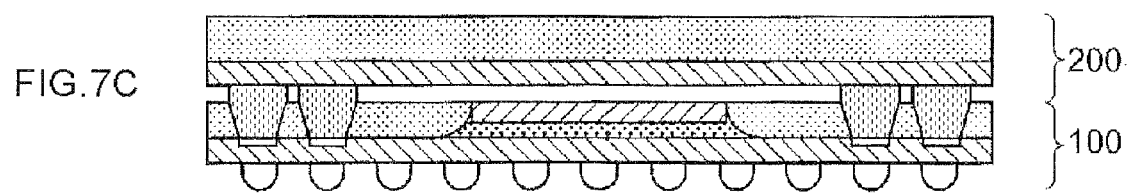

As shown in FIG. 7B, the solder humps 19 on the back surface of the second semiconductor package 200 are arranged above the openings 16 of the first semiconductor package 100 and then these packages are stacked.

Subsequently, a reflow process is conducted to cause the solder bumps 19 and the soldering paste 23 being melted, thereby providing an integrated coupling portion.

In the present embodiment, the openings 16 of the first semiconductor package 100 are filled with soldering paste 23 or the like, so that the better junction with the second semiconductor package 200 located in the above thereof can be further assured, thereby providing an improved production yield for the PoP devices.

Fourth Embodiment

The present embodiment is characterized in the process for stacking the second semiconductor package over the first semiconductor package. Therefore, other processes in the manufacture are similar as that of first embodiment or second embodiment, and the description is not repeated. In addition, the first semiconductor package and the second semiconductor package are not limited to wire bonding. Similar advantageous effect as obtained in the above-described embodiment is also obtained in the present embodiment.

Figure 8:
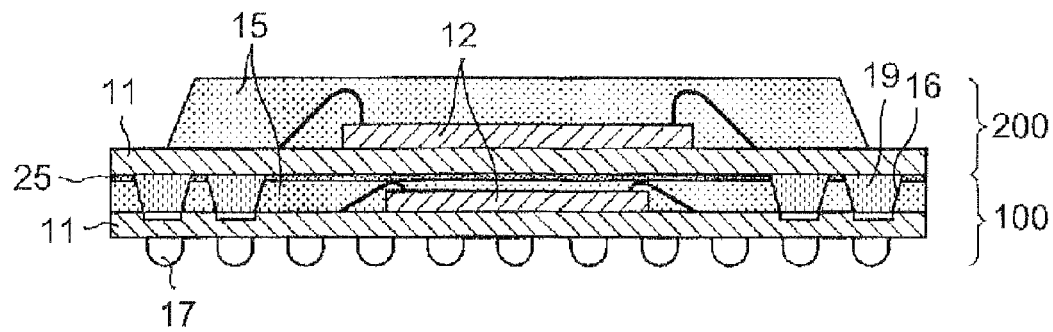
FIG. 8 is a cross-sectional view of a semiconductor device illustrating fourth embodiment of the present invention.

FIG. 8 is a cross sectional view of a PoP structure that includes the second semiconductor package 200 stacked on the first semiconductor package 100. Before stacking two semiconductor devices, an adhesive agent such as thermosetting adhesive agent 25 is applied on the portions of the back surface of the second semiconductor package 200 except the portions having electric conductors such as solder bumps 19. Thus, the thermosetting adhesive agent 25 is present in the interface between the first semiconductor package 100 and the second semiconductor package 200, functioning as integrating the both semiconductor devices.

This allows providing a structure that is equivalent to that being filled with the underfill resin by the resin 15 and the thermosetting adhesive agent 25 of the first semiconductor package 100, in view of the solder bumps 19 of the second semiconductor package 200, thereby providing an improved junction reliability of the semiconductor device.

Fifth Embodiment

The present embodiment is characterized in the process for stacking the second semiconductor package over the first semiconductor package. Therefore, other processes in the manufacture are similar as that of first embodiment or second embodiment, and the description is not repeated. Similar advantageous effect as obtained in the above-described embodiment is also obtained in the present embodiment.

Figure 9:
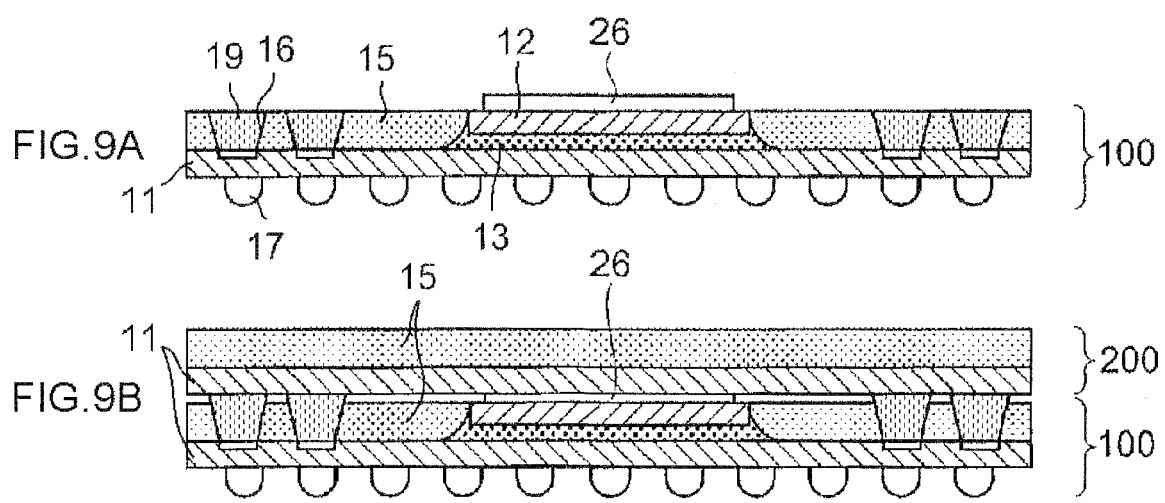
FIGS. 9A and 9B are cross-sectional views of a semiconductor device according to fifth embodiment of the present invention.
Figure 10:
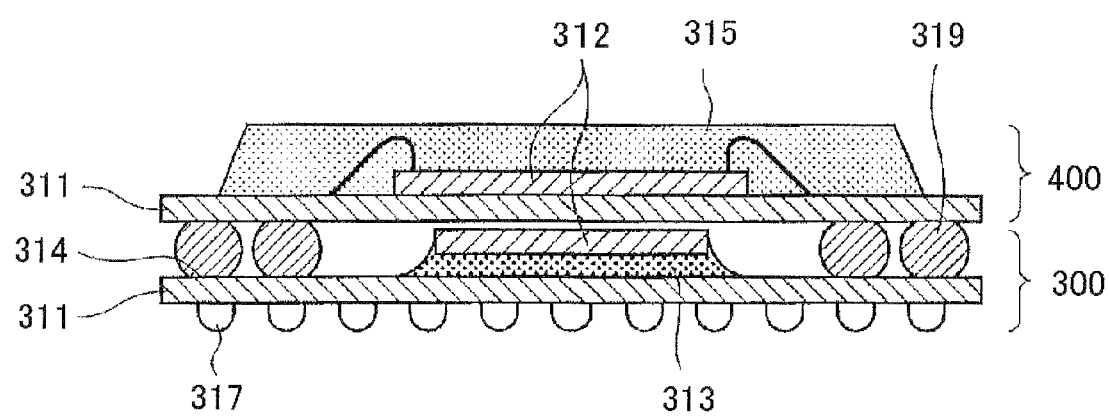
FIG. 10 is a cross-sectional view of a semiconductor device according a conventional technology.
Figure 11A:
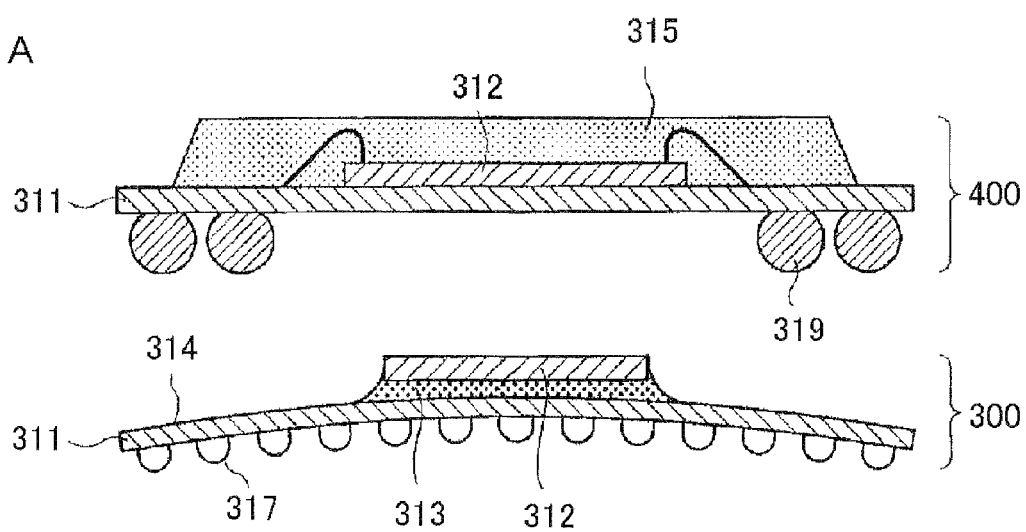
FIGS. 11A and 11B are cross-sectional views of a semiconductor device according another conventional technology.
Figure 11B:
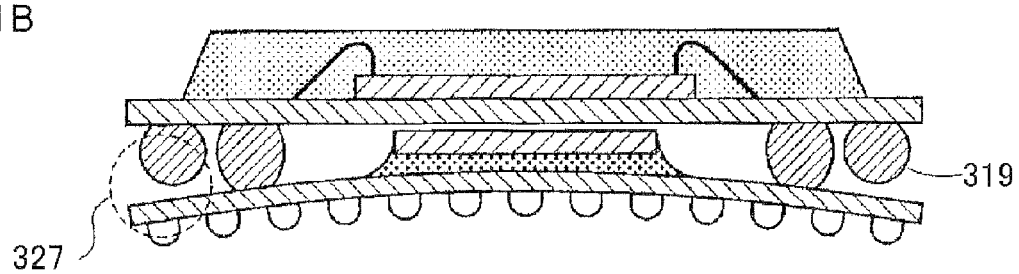

As shown in FIG. 9A, the first semiconductor package 100 is composed of the flip-chip coupled semiconductor element 12. A film having a heat-releasing function such as a heat-releasing paste 26 is applied on the back surface of the semiconductor element 12.

When the second semiconductor package 200 is stacked on the first semiconductor package 100 as shown in FIG. 9B, a heat generated in the first semiconductor package 100 is dissipated to the second semiconductor package 200 by virtue of the heat-releasing paste 26. More specifically, according to the present embodiment, the second semiconductor package 200 functions as a heat sink for the first semiconductor package 100. Thus, according to the present embodiment, a heat generated in the first semiconductor package 100 can be effectively dissipated, thereby providing a further improved coupling reliability.

It is apparent that the present invention is not limited to the above embodiment, and may be modified and changed without departing from the scope and spirit of the invention.

What is claimed is:

1. A method for manufacturing a multiple-layered semiconductor device having a multiple-layered structure including stacked two or more semiconductor packages, comprising:

installing a semiconductor device on a substrate including a coupling land that is provided in a first semiconductor package, said first semiconductor package being disposed in a layer other than a top layer in the multiple-layered structure;

forming a resin on said substrate around said semiconductor device;

forming a plurality of openings extending from an upper surface of said resin to said coupling land;

forming a second semiconductor package with plural electric conductors projecting from a lower surface;

after forming the second semiconductor package, stacking and coupling the second semiconductor package onto said first semiconductor package by inserting the projecting electric conductors into respective ones of said openings; and after inserting the projecting electric conductors into respective ones of said openings, melting the electric conductors, wherein said stacking and coupling the second semiconductor package onto said first semiconductor package includes adhering an upper surface of said first semiconductor package to the lower surface of said second semiconductor package via an adhesive agent.

2. The method for manufacturing the multiple-layered semiconductor device as set forth in claim 1, wherein said stacking and coupling the second semiconductor package onto said first semiconductor package includes applying said adhesive agent on regions in the lower surface said second semiconductor package except regions where said electric conductor is formed.

3. A method for manufacturing a multiple-layered semiconductor device having a multiple-layered structure including stacked two or more semiconductor packages, comprising:

installing a semiconductor device on a substrate including a coupling land that is provided in a first semiconductor package, said first semiconductor package being disposed in a layer other than a top layer in the multiple-layered structure;

forming a resin on said substrate around said semiconductor device;

forming a plurality of openings extending from an upper surface of said resin to said coupling land;

forming a second semiconductor package with plural electric conductors projecting from a lower surface;

after forming the second semiconductor package, stacking and coupling the second semiconductor package onto said first semiconductor package by inserting the projecting electric conductors into respective ones of said openings; and after inserting the projecting electric conductors into respective ones of said openings, melting the electric conductors, wherein said stacking and coupling the second semiconductor package onto said first semiconductor package includes forming a film having a heat-releasing function on a back surface of said semiconductor device of said first semiconductor package that is flip-chip coupled thereto.

4. The method for manufacturing the multiple-layered semiconductor device as set forth in claim 3, wherein said film having a heat-releasing function is a heat-releasing paste.

* * * * *